(12) United States Patent
Lee

(10) Patent No.: US 7,871,910 B2
(45) Date of Patent: Jan. 18, 2011

(54) FLASH MEMORY DEVICE AND METHOD OF FABRICATING THE SAME

(75) Inventor: Jae Jung Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 344 days.

(21) Appl. No.: 12/137,101

(22) Filed: Jun. 11, 2008

(65) Prior Publication Data

US 2009/0166709 A1    Jul. 2, 2009

(30) Foreign Application Priority Data

Dec. 28, 2007   (KR) .................. 10-2007-0140283

(51) Int. Cl.
*H01L 21/3205* (2006.01)
(52) U.S. Cl. .................. 438/585; 438/166; 438/257; 438/592; 438/594; 257/E21.621
(58) Field of Classification Search .................. 438/585
See application file for complete search history.

(56) References Cited

U.S. PATENT DOCUMENTS

| | | | | |
|---|---|---|---|---|
| 5,350,698 A | * | 9/1994 | Huang et al. | 438/305 |
| 5,432,110 A | * | 7/1995 | Inoue | 438/151 |
| 5,767,004 A | * | 6/1998 | Balasubramanian et al. | 438/592 |
| 6,362,511 B1 | * | 3/2002 | Mizushima et al. | 257/412 |
| 2005/0017312 A1 | * | 1/2005 | Jeng et al. | 257/411 |
| 2009/0072294 A1 | * | 3/2009 | Yang et al. | 257/321 |

FOREIGN PATENT DOCUMENTS

| | | |
|---|---|---|
| CN | 1328343 A | 12/2001 |
| JP | 2005-340844 A | 12/2005 |
| KR | 10-2007-0079644 | 8/2007 |
| KR | 10-2007-0092509 | 9/2007 |
| KR | 10-2007-0093252 | 9/2007 |

* cited by examiner

*Primary Examiner*—Kenneth A Parker
*Assistant Examiner*—Jose R Diaz
(74) *Attorney, Agent, or Firm*—Marshall, Gerstein & Borun LLP

(57) ABSTRACT

A flash memory device and method of fabricating thereof. In accordance with the method of the invention, a tunnel dielectric layer and an amorphous first conductive layer are formed over a semiconductor substrate. An annealing process to change the amorphous first conductive layer to a crystallized first conductive layer is performed. A second conductive layer is formed on the crystallized first conductive layer. A first etch process to pattern the second conductive layer is performed. A second etch process to remove an oxide layer on the crystallized first conductive layer is performed. A third etch process to pattern the amorphous first conductive layer is performed.

17 Claims, 2 Drawing Sheets

FLASH MEMORY DEVICE AND METHOD OF FABRICATING THE SAME

CROSS-REFERENCE TO RELATED APPLICATION

Priority to Korean patent application number 10-2007-0140283, filed on Dec. 28, 2007, the disclosure of which is incorporated by reference in its entirety, is claimed.

BACKGROUND OF THE INVENTION

The invention relates to a method of fabricating a flash memory device and, more particularly, to a method of fabricating a flash memory device, which can easily form a floating gate by improving the patterning process of the floating gate.

As the degree of integration of semiconductor memory devices increases, not only the width of gates, but also the distance between the gates is narrowed. To form such micro patterns, processes for forming such semiconductor memory devices have necessarily been improved. A method for forming a flash memory device is described below by way of example.

A tunnel dielectric layer is formed over a semiconductor substrate (a gate dielectric layer is formed in a peri region). A conductive layer for a floating gate is formed. Isolation trenches are formed by performing an etch process. Isolation layers are formed within the trenches and a dielectric layer is formed on a surface of the isolation layers and the conductive layer for the floating gate. A conductive layer for a control gate is formed on the dielectric layer. A hard mask layer for a gate patterning process and photoresist patterns are then formed. The hard mask layer is patterned along the photoresist patterns. The conductive layer for the control gate, the dielectric layer, the conductive layer for the floating gate, and a tunnel dielectric layer (a gate dielectric layer) are sequentially patterned along the patterned hard mask layer patterns.

However, as the degree of integration of semiconductor memory devices increases, the distance between the floating gates is further narrowed, which may cause a disturbance phenomenon between memory cells.

BRIEF SUMMARY OF THE INVENTION

In one aspect, the method of the invention reduces disturbance between neighboring memory cells by forming a floating gate having a structure in which a plurality of conductive layers are stacked.

In another aspect, the method of the invention may prevent a phenomenon in which the bottom of a floating gate becomes wider than the top of the floating gate by performing an etch process using a gas including fluorine (F) in the patterning process of plural conductive layers.

A method of fabricating a flash memory device in accordance with an aspect of the invention comprises forming a tunnel dielectric layer and an amorphous first conductive layer over a semiconductor substrate, performing an annealing process for changing the amorphous first conductive layer to a crystallized first conductive layer, forming a second conductive layer on the crystallized first conductive layer, performing a first etch process to pattern the second conductive layer, performing a second etch process to remove an oxide layer on the crystallized first conductive layer, and performing a third etch process to pattern the amorphous first conductive layer.

The amorphous first conductive layer preferably comprises an undoped polysilicon layer. The crystallized first conductive layer preferably an undoped polysilicon layer.

The second conductive layer preferably comprises a doped polysilicon layer. The amorphous first conductive layer is preferably formed to a thickness of 200 angstrom to 400 angstrom.

The crystallized first conductive layer is preferably formed to a thickness of 1 angstrom to 50 angstrom. The second conductive layer is preferably formed to a thickness of 300 angstrom to 700 angstrom.

The first, second, and third etch processes are preferably performed using a dry etch process. The first etch process and the third etch process may be performed by generating plasma using a mixed gas, preferably a mixed gas comprising $HBr$ and $O_2$ or a mixed gas comprising $HBr$, $Cl_2$, and $O_2$.

The second etch process is preferably performed by generating plasma, preferably using a fluorine (F) gas or a gas containing fluorine (F). The gas containing fluorine (F) preferably comprises $C_xF_y$, preferably $C_2F_6$, $C_3F_8$, $C_4F_8$, or $C_5F_8$, $SF_6$, or $NF_3$.

Before the first etch process is performed, a fourth etch process of removing an oxide layer on the second conductive layer may be performed. The fourth etch process is preferably performed using a dry etch process of generating plasma by employing fluorine (F) gas or a gas containing fluorine (F). The gas containing fluorine (F) preferably comprises $C_xF_y$, preferably $C_2F_6$, $C_3F_8$, $C_4F_8$, or $C_5F_8$, $SF_6$, or $NF_3$.

A flash memory device in accordance with an aspect of the invention comprises a tunnel dielectric layer formed on a semiconductor substrate, a first conductive layer and a second conductive layer formed over the tunnel dielectric layer, and a dielectric layer and a third conductive layer formed over the second conductive layer.

The first conductive layer preferably comprise an undoped polysilicon layer. A top surface of the first conductive layer preferably comprises a crystallized first conductive layer. The second conductive layer preferably comprises a doped polysilicon layer.

DESCRIPTION OF SPECIFIC EMBODIMENTS

A specific embodiment according to the invention is described below with reference to the accompanying drawings. However, the invention is not limited to the disclosed embodiment, but may be implemented in various manners. The embodiment is provided to complete the disclosure of the invention and to enable those having ordinary skill in the art to understand and practice the invention. The scope of the invention is defined by the claims.

FIGS. 1a to 1f are sectional views illustrating a flash memory device and a method of fabricating the same in accordance with the invention.

Figure 1A:
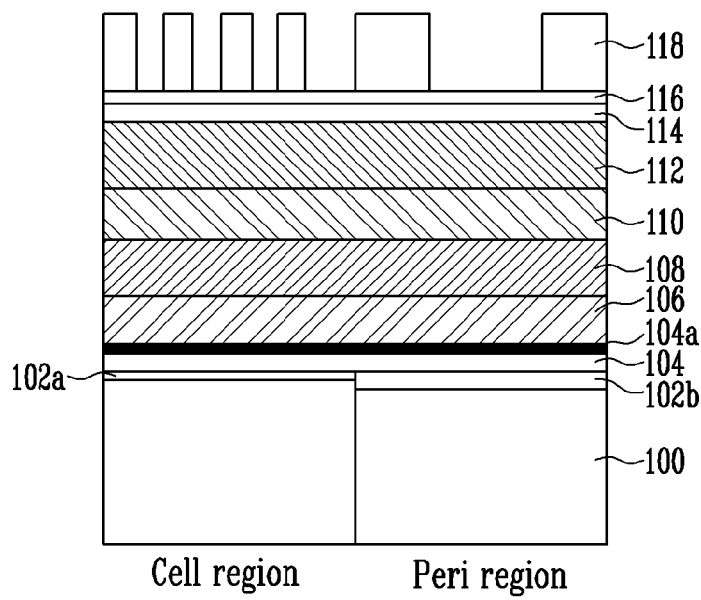
FIGS. 1a to 1f are sectional views illustrating a flash memory device and a method of fabricating the same in accordance with the invention.

FIG. 1a illustrates a semiconductor substrate 100 including a cell region and a peri region. A tunnel dielectric layer 102a is formed in the cell region of the semiconductor substrate 100. A gate dielectric layer 102b thicker than the tunnel dielectric layer 102a is formed in the peri region of the semiconductor substrate 100. A first conductive layer 104 for a floating gate is formed on the tunnel dielectric layer 102a and the gate dielectric layer 102b. The first conductive layer 104 is illustratively and preferably formed of undoped amorphous polysilicon in order to prohibit a change in the threshold voltage of a memory cell and is illustratively and preferably formed, preferably to a thickness of 200 angstrom to 400 angstrom.

After the first conductive layer 104 is formed, an annealing process is performed in order to improve the electrical characteristics. As the annealing process is carried out, a top surface of the first conductive layer 104 is crystallized and thus changed into a second conductive layer 104a. For example, the second conductive layer 104a can be formed at a depth of 1 angstrom to 50 angstrom from the top of the first conductive layer 104. Here, the top surface of the second conductive layer 104a, which has been crystallized due to the annealing process, is oxidized, so an oxide layer may be formed. A patterning process on the oxide layer is described later on with reference to FIG. 1c.

A third conductive layer 106 is formed on the second conductive layer 104a. The third conductive layer 106 is illustratively and preferably formed of doped polysilicon, preferably to a thickness of 300 angstrom to 700 angstrom. A hard mask layer and photoresist patterns 118 whose isolation regions are opened are then formed over the third conductive layer 106. For example, the hard mask layer may be formed by sequentially laminating first to fourth hard mask layers 108 to 114. The first hard mask layer 108 is preferably formed of a nitride layer, the second hard mask layer 110 is preferably formed of an oxide layer, the third hard mask layer 112 is preferably formed of an amorphous carbon layer, and the fourth hard mask layer 114 is preferably formed of an oxynitride layer. An ARC (Anti-Reflective Coating) layer 116 for easily performing an exposure process is illustratively and preferably formed between the fourth hard mask layer 114 and the photoresist patterns 118.

Figure 1B:
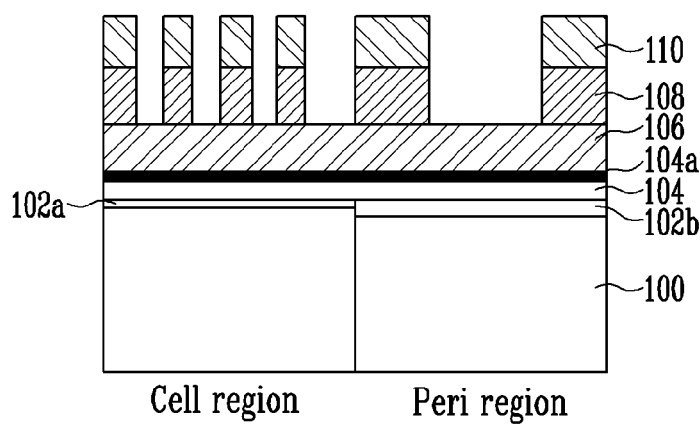

Referring to FIG. 1b, the ARC layer (refer to 116 of FIG. 1a), the fourth hard mask layer (refer to 114 of FIG. 1a), and the third hard mask layer (refer to 112 of FIG. 1a) are patterned by performing an etch process along the photoresist patterns (refer to 118 of FIG. 1a). The photoresist patterns (refer to 118 of FIG. 1a), the ARC layer (refer to 116 of FIG. 1a) and the fourth hard mask layer (refer to 114 of FIG. 1a) are removed. The second hard mask layer 110 is patterned along the pattern of the third hard mask layer (refer to 112 of FIG. 1a), and the third hard mask layer (refer to 114 of FIG. 1a) is removed. Thereafter, the third conductive layer 106 is exposed by patterning the first hard mask layer 108 along the pattern of the second hard mask layer 110.

Figure 1C:
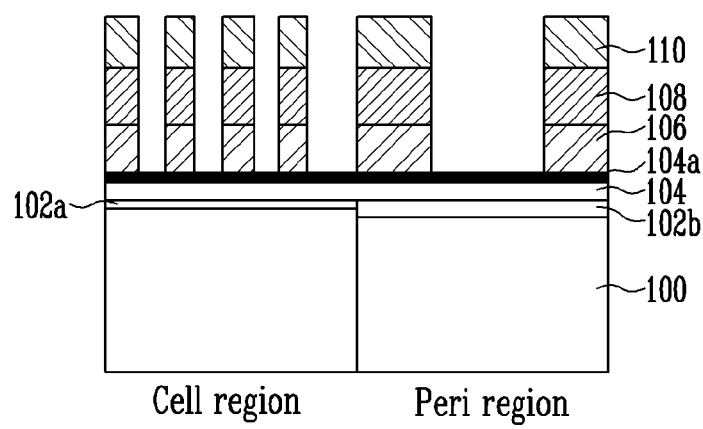

Referring to FIG. 1c, if oxide layers with different etch selectivity are formed over the third conductive layer 106, the underlying conductive layer is difficult to etch. Thus, it is preferred that a first etch process of removing the oxide layers (not shown) be performed. The first etch process is preferably performed using a dry etch process. The dry etch process is preferably performed by generating plasma employing a fluorine (F) gas or plasma employing a gas containing fluorine (F). For example, the gas containing F preferably comprises $C_xF_y$, preferably $C_2F_6$, $C_3F_8$, $C_4F_8$, or $C_5F_8$, $SF_6$, or $NF_3$.

A second etch process of patterning the third conductive layer 106 is then performed. The second etch process is preferably performed using a dry etch process. The dry etch process is preferably performed by generating plasma employing a mixed gas comprising HBr and $O_2$ or a mixed gas comprising HBr, $Cl_2$, and $O_2$. The second conductive layer 104a is exposed by patterning the third conductive layer 106.

Figure 1D:
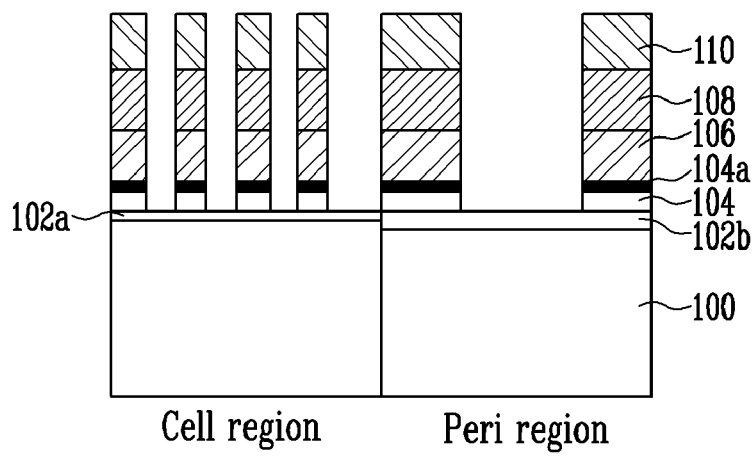

Referring to FIG. 1d, a third etch process of removing an oxide layer, which may be formed in the annealing process of the first conductive layer 104, is carried out. The third etch process is preferably performed using a dry etch process. The dry etch process is preferably performed by generating plasma, preferably employing a fluorine (F) gas or a gas containing fluorine (F). For example, the gas including fluorine (F) preferably comprises $C_xF_y$, preferably $C_2F_6$, $C_3F_8$, $C_4F_8$, or $C_5F_8$, $SF_6$, or $NF_3$. Here, in order to completely remove the exposed oxide layer, an etch process is preferably performed so that the second conductive layer 104a is exposed. For example, the third etch process is preferably performed so that the oxide layer is removed at a depth of 1 angstrom to 100 angstrom from the exposed surface, thus exposing the second conductive layer 104a or the first conductive layer 104.

A fourth etch process of sequentially patterning the second conductive layer 104a and the first conductive layer 104 is then illustratively and preferably performed. The fourth etch process is preferably performed using a dry etch process. The dry etch process is preferably performed by generating plasma, preferably employing a mixed gas comprising HBr and $O_2$ or a mixed gas comprising HBr, $Cl_2$, and $O_2$. At the time of the fourth etch process, the etch process is preferably and illustratively performed such that the etch selectivity of the first conductive layer 104 with respect to the underlying tunnel dielectric layer 102a and the underlying gate dielectric layer 102b is 20:1 to 50:1 in order to prevent damage to the semiconductor substrate 100.

Figure 1E:
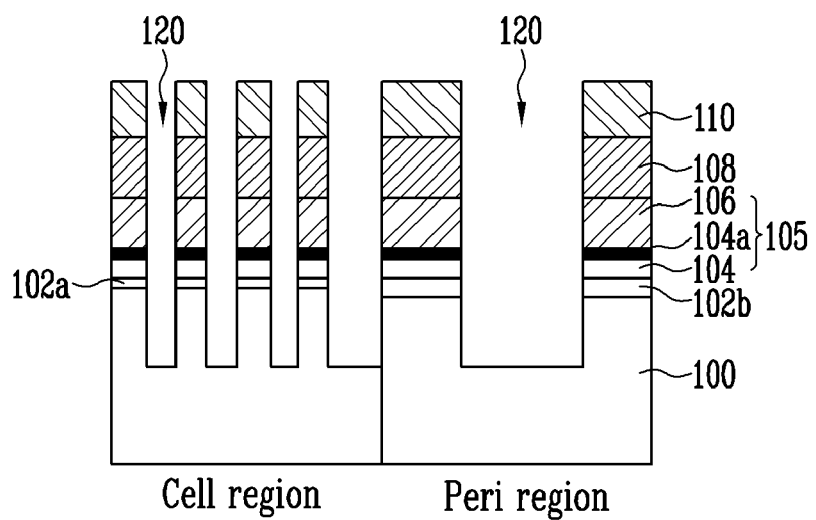

Referring to FIG. 1e, the exposed tunnel dielectric layer 102a and the exposed gate dielectric layer 102b are patterned and the exposed semiconductor substrate 100 is removed, thus forming trenches 120. Here, any remaining portion of the second hard mask layer (refer to 110 of FIG. 1d) is preferably completely removed.

Figure 1F:
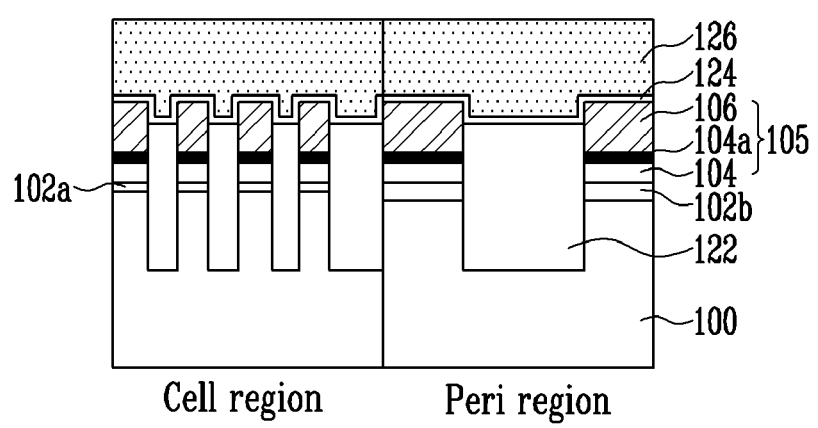

Referring to FIG. 1f, isolation layers 122 are formed within the trenches (refer to 120 of FIG. 1e). The first hard mask layer (refer to 108 of FIG. 1e) is removed. After the EFH (Effective Field oxide Height) of the isolation layers 122 is controlled, a dielectric layer 124 is formed on a surface of the isolation layers 122 and a floating gate 105. A fourth conductive layer 126 for a control gate is formed on the dielectric layer 124.

Accordingly, the steep lateral slope of the conductive layer for the floating gate can be maintained, i.e., prevented from becoming gentle. Thus, a distance between the floating gates 105 can be secured and damage to the semiconductor substrate 100 can be prevented.

As described above, according to the invention, disturbance between neighboring memory cells can be reduced by forming the floating gate having a plurality of the conductive layers.

Further, when an oxide layer is formed at an interface in the patterning process of the plurality of conductive layers, the oxide layer is preferably removed using a gas containing fluorine (F). Accordingly, a phenomenon in which the bottom of the floating gate becomes wider than the top of the floating gate can be prevented. Consequently, disturbance between memory cells can be further reduced.

The embodiment disclosed herein has been proposed to allow a person skilled in the art to easily implement the invention, and the person skilled in the part may implement the invention by a combination of these embodiments. Therefore, the scope of the invention is not limited by or to the embodiment as described above, and should be construed to be defined only by the appended claims and their equivalents.

What is claimed is:

1. A method of fabricating a flash memory device, comprising:
   forming a tunnel dielectric layer and an amorphous first conductive layer over a semiconductor substrate;
   performing an annealing process to partially change the amorphous first conductive layer to a crystallized first conductive layer;
   forming a second conductive layer on the crystallized first conductive layer;
   performing a first etch process to pattern the second conductive layer;
   performing a second etch process to remove any oxide layer on the crystallized first conductive layer; and
   performing a third etch process to pattern the crystallized first conductive layer and the amorphous first conductive layer.

2. The method of claim 1, wherein the amorphous first conductive layer comprises an undoped polysilicon layer.

3. The method of claim 1, wherein the crystallized first conductive layer comprises an undoped polysilicon layer.

4. The method of claim 1, wherein the second conductive layer comprises a doped polysilicon layer.

5. The method of claim 1, comprising forming the amorphous first conductive layer to a thickness of 200 angstrom to 400 angstrom.

6. The method of claim 1, comprising forming the crystallized first conductive layer to a thickness of 1 angstrom to 50 angstrom.

7. The method of claim 1, comprising forming the second conductive layer to a thickness of 300 angstrom to 700 angstrom.

8. The method of claim 1, comprising performing the first, second, and third etch processes using a dry etch process.

9. The method of claim 1, comprising performing the first etch process and the third etch process by generating plasma using a mixed gas comprising HBr and $O_2$ or a mixed gas comprising HBr, $Cl_2$, and $O_2$.

10. The method of claim 1, comprising performing the second etch process by generating plasma using a fluorine (F) gas or a gas containing fluorine (F).

11. The method of claim 10, comprising performing the second etch process by generating plasma using a gas containing $C_xF_y$, $SF_6$, or $NF_3$.

12. The method of claim 11, wherein the gas contains $C_2F_6$, $C_3F_8$, $C_4F_8$, or $C_5F_8$.

13. The method of claim 1, comprising, before performing the first etch process, performing a fourth etch process to remove an oxide layer on the second conductive layer.

14. The method of claim 13, comprising performing the fourth etch process using a dry etch process of generating plasma by employing a fluorine (F) gas or a gas containing fluorine (F).

15. The method of claim 14, comprising performing the fourth etch process using a dry etch process of generating plasma by employing a gas comprising $C_xF_y$, $SF_6$, or $NF_3$.

16. The method of claim 15, wherein the gas contains $C_2F_6$, $C_3F_8$, $C_4F_8$, or $C_5F_8$.

17. A flash memory device fabricated by the method according to claim 1.

* * * * *